(12) United States Patent
Peng et al.

(10) Patent No.: US 11,862,663 B2
(45) Date of Patent: Jan. 2, 2024

(54) DISPLAY PANEL AND DISPLAY DEVICE

(71) Applicant: Wuhan China Star Optoelectronics Semiconductor Display Technology Co., Ltd., Wuhan (CN)

(72) Inventors: Jiuhong Peng, Wuhan (CN); Shiyan Xiao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/960,552

(22) PCT Filed: May 26, 2020

(86) PCT No.: PCT/CN2020/092327
§ 371 (c)(1),
(2) Date: Jul. 8, 2020

(87) PCT Pub. No.: WO2021/196376
PCT Pub. Date: Oct. 7, 2021

(65) Prior Publication Data
US 2023/0090872 A1   Mar. 23, 2023

(30) Foreign Application Priority Data
Apr. 2, 2020   (CN) .......................... 202010254497.5

(51) Int. Cl.
*H01L 27/15* (2006.01)
*H01L 33/62* (2010.01)

(52) U.S. Cl.
CPC ............ *H01L 27/156* (2013.01); *H01L 33/62* (2013.01)

(58) Field of Classification Search
CPC ... H01L 27/156; H01L 33/62; G02F 2201/52; G02F 1/134309; G02F 1/1333; G09F 9/302; H04N 23/57
See application file for complete search history.

(56) References Cited

U.S. PATENT DOCUMENTS

| | | | |
|---|---|---|---|
| 2017/0256232 A1 | 9/2017 | Xu et al. | |
| 2019/0326366 A1* | 10/2019 | Fan | H10K 59/35 |
| 2020/0066809 A1* | 2/2020 | Liu | G09G 3/3225 |

(Continued)

FOREIGN PATENT DOCUMENTS

| | | |
|---|---|---|
| CN | 105185248 A | 12/2015 |
| CN | 107911507 A | 4/2018 |

(Continued)

*Primary Examiner* — Ratisha Mehta
(74) *Attorney, Agent, or Firm* — Nathan & Associates; Menachem Nathan (57) ABSTRACT

A display panel and a display device are provided. The display panel includes a first display area and a second display area corresponding to a position of an electronic component, wherein a light transmittance of the second display area is greater than a light transmittance of the first display area. A plurality of pixel units are disposed in the second display area, a ratio of a number of the first sub-pixels to the second sub-pixels and the third sub-pixels is 1:1:2 in each of the pixel units of the second display area, and by providing pixels with larger intervals in the second display area, a light transmittance above the electronic component is increased.

18 Claims, 5 Drawing Sheets

(56) References Cited

U.S. PATENT DOCUMENTS

2020/0242996 A1  7/2020  Wang et al.
2020/0395418 A1* 12/2020  Han ..................... G02F 1/1337

FOREIGN PATENT DOCUMENTS

| CN | 108269840 A | 7/2018 |
| CN | 108364967 A | 8/2018 |
| CN | 108461521 A | 8/2018 |
| CN | 108830234 A | 11/2018 |
| CN | 109584778 A | 4/2019 |
| CN | 210120138 U | 2/2020 |
| CN | 110914891 A | 3/2020 |

* cited by examiner

DISPLAY PANEL AND DISPLAY DEVICE

FIELD OF INVENTION

The present disclosure relates to the field of display technology, and more particularly to a display panel and a display device.

BACKGROUND OF INVENTION

Currently display devices are equipped with electronic components, such as cameras by digging holes. With an increase in demand, it has become more and more important to achieve a full screen effect. In particular, disposing electronic components, such as cameras under the display panel has become particularly important. Therefore, current display devices have a technical problem of digging holes in order to equip electronic components.

SUMMARY OF INVENTION

The present disclosure provides a display panel and a display device, which are used to solve the technical problem that the currently display devices need to dig holes to set electronic components.

In order to solve the above problems, the technical solutions provided by the present disclosure are as follows:

The present disclosure provides a display panel, the display panel includes a first display area and a second display area disposed corresponding to a position of an electronic component, wherein a light transmittance of the second display area is greater than a light transmittance of the first display area, a plurality of pixel units are disposed in the second display area, and each of the pixel units comprises a plurality of first sub-pixels, a plurality of second sub-pixels, and a plurality of third sub-pixels, a ratio of a number of the first sub-pixels to the second sub-pixels and the third sub-pixels is 1:1:2 in each of the pixel units of the second display area.

In the display panel provided in the present disclosure, wherein a plurality of pixel units are disposed in the first display area, and each of the pixel units comprises a plurality of first sub-pixels, a plurality of second sub-pixels, and a plurality of third sub-pixels, a ratio of a number of the first sub-pixels to the second sub-pixels and the third sub-pixels is 1:1:1 in each of the pixel units of the first display area.

In the display panel provided in the present disclosure, wherein an angle between any sub-pixel and two adjacent sub-pixels in the second display area is 120 degrees.

In the display panel provided in the present disclosure, wherein the plurality of third sub-pixels are red sub-pixels.

In the display panel provided in the present disclosure, wherein the plurality of third sub-pixels are blue sub-pixels.

In the display panel provided in the present disclosure, wherein the plurality of third sub-pixels are green sub-pixels In the display panel provided in the present disclosure, wherein a metal trace in the second display area is arranged around the electronic component.

In the display panel provided in the present disclosure, wherein distances between the adjacent third sub-pixels are equal in the pixel unit of the second display area.

In the display panel provided in the present disclosure, wherein a ratio of a distance between the adjacent first sub-pixels to a distance between the adjacent second sub-pixels and a distance between the adjacent third sub-pixels is 1:1:1 in the pixel unit of the second display area.

In the display panel provided in the present disclosure, wherein the electronic component is a camera.

Embodiments of the present disclosure provides a display device including a display panel, the display panel including a first display area and a second display area disposed corresponding to a position of an electronic component, wherein a light transmittance of the second display area is greater than a light transmittance of the first display area, a plurality of pixel units are disposed in the second display area, and each of the pixel units includes a plurality of first sub-pixels, a plurality of second sub-pixels, and a plurality of third sub-pixels, a ratio of a number of the first sub-pixels to the second sub-pixels and the third sub-pixels is 1:1:2 in each of the pixel units of the second display area.

In the display device provided in the present disclosure, wherein a metal trace in the second display area is arranged around the electronic component.

In the display device provided in the present disclosure, wherein distances between the adjacent third sub-pixels are equal in the pixel unit of the second display area.

In the display device provided in the present disclosure, wherein a ratio of a distance between the adjacent first sub-pixels to a distance between the adjacent second sub-pixels and a distance between the adjacent third sub-pixels is 1:1:1 in the pixel unit of the second display area.

In the display device provided in the present disclosure, wherein the electronic component is a camera.

In the display device provided in the present disclosure, wherein a plurality of pixel units are disposed in the first display area, and each of the pixel units comprises a plurality of first sub-pixels, a plurality of second sub-pixels, and a plurality of third sub-pixels, a ratio of a number of the first sub-pixels to the second sub-pixels and the third sub-pixels is 1:1:1 in each of the pixel units of the first display area.

In the display device provided in the present disclosure, wherein the plurality of third sub-pixels are red sub-pixels.

In the display device provided in the present disclosure, wherein the plurality of third sub-pixels are blue sub-pixels.

In the display device provided in the present disclosure, wherein the plurality of third sub-pixels are green sub-pixels.

In the display device provided in the present disclosure, wherein an angle between any sub-pixel and two adjacent sub-pixels in the second display area is 120 degrees.

The beneficial effects of the present disclosure are as follows: The present disclosure provides a display panel and a display device, the display panel includes a first display area and a second display area disposed corresponding to a position of an electronic component, wherein a light transmittance of the second display area is greater than a light transmittance of the first display area, a plurality of pixel units are disposed in the second display area, and each of the pixel units includes a plurality of first sub-pixels, a plurality of second sub-pixels, and a plurality of third sub-pixels, a ratio of a number of the first sub-pixels to the second sub-pixels and the third sub-pixels is 1:1:2 in each of the pixel units of the second display area; by providing pixels with larger intervals in the second display area, increasing a light transmittance above the electronic component, alleviating the currently technical problem of digging holes to set up electronic components.

DESCRIPTION OF FIGURES

The technical solution and other beneficial effects of the present disclosure will be apparent through the detailed description of the specific implementation of the present disclosure and the accompanying figures.

DETAILED DESCRIPTION OF PREFERRED EMBODIMENTS

In the following, the technical solutions in the embodiments of the present disclosure will be clearly and completely described with reference to the figures. Obviously, the described embodiments are only some embodiments of the present disclosure, not all the embodiments. Based on the embodiments in the present disclosure, all other embodiments obtained by a person of ordinary skill in the art without creative steps shall fall within the protection scope of the present disclosure.

In the description of the present disclosure, it should be understood that the terms of center, longitudinal, transverse, length, width, thickness, upper, lower, front, rear, left, right, vertical, horizontal, top, bottom, inside, outside, clockwise, counterclockwise, etc. or a positional relationship based on orientation or position shown in the figures are only for the convenience of describing the present disclosure and simplifying the description, rather than indicating or implying the device or element referred to must have a specific orientation, structure, or operation. Therefore, it cannot be understood as a limitation of the present disclosure. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present disclosure, the meaning of "a plurality" is two or more, unless otherwise specifically limited.

In the description of the present disclosure, it should be noted that, unless otherwise clearly specified and limited, the terms "install", "link", and "connect" should be understood in a broad sense, for example, it can be fixed connection or detachable connection, or integrally connection; may be mechanical connection, electrical connection, or may be signal connect with each other; which may be directly connected, or may be indirectly connected through an intermediary, may be a connection between two elements or the interaction relationship of two elements. Those of ordinary skill in the art can understand the specific meanings of the above terms in the present disclosure according to specific situations.

In the present disclosure, unless otherwise clearly specified and defined, the first feature "above" or "below" the second feature may include a direct contact between the first feature and second feature, or may include the first feature and second feature not contact directly but through another feature between them. Moreover, the first feature is "above", "on" or "upon" the second feature includes that the first feature is directly above and obliquely above the second feature, or simply means that a horizontal level of the first feature is higher than a horizontal level of the second feature. The first feature is "below", "under" and "underneath" the second feature includes that the first feature is directly below and obliquely below the second feature, or simply means that a horizontal level of the first feature is less than a horizontal level of the second feature.

The following disclosure provides many different implementations or examples for implementing different structures of the present disclosure. In order to simplify the disclosure of the present disclosure, the components and settings of specific examples are described below. Of course, they are only examples, and the purpose is not to limit the present disclosure. In addition, the present disclosure may repeat reference numerals and/or reference letters in different embodiments. Such repetition is for the purpose of simplicity and clarity, and does not itself indicate the relationship between the various embodiments and/or settings discussed. In addition, the present disclosure provides examples of various specific processes and materials, but those of ordinary skill in the art may be aware of the application of other processes and/or the use of other materials.

Figure 1:
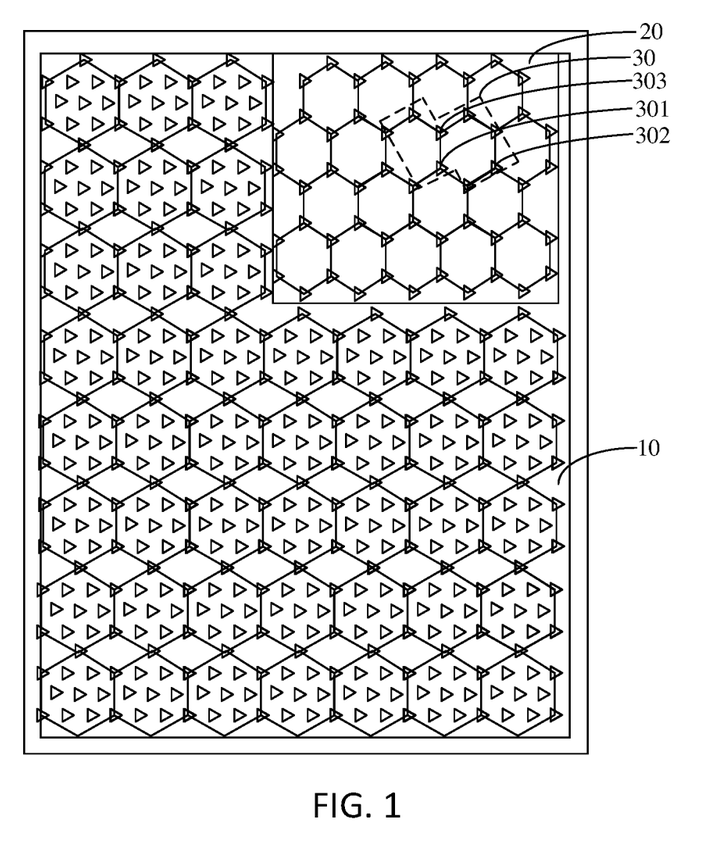
FIG. 1 is a schematic diagram of a display panel of one embodiment of the present disclosure.
Figure 2:
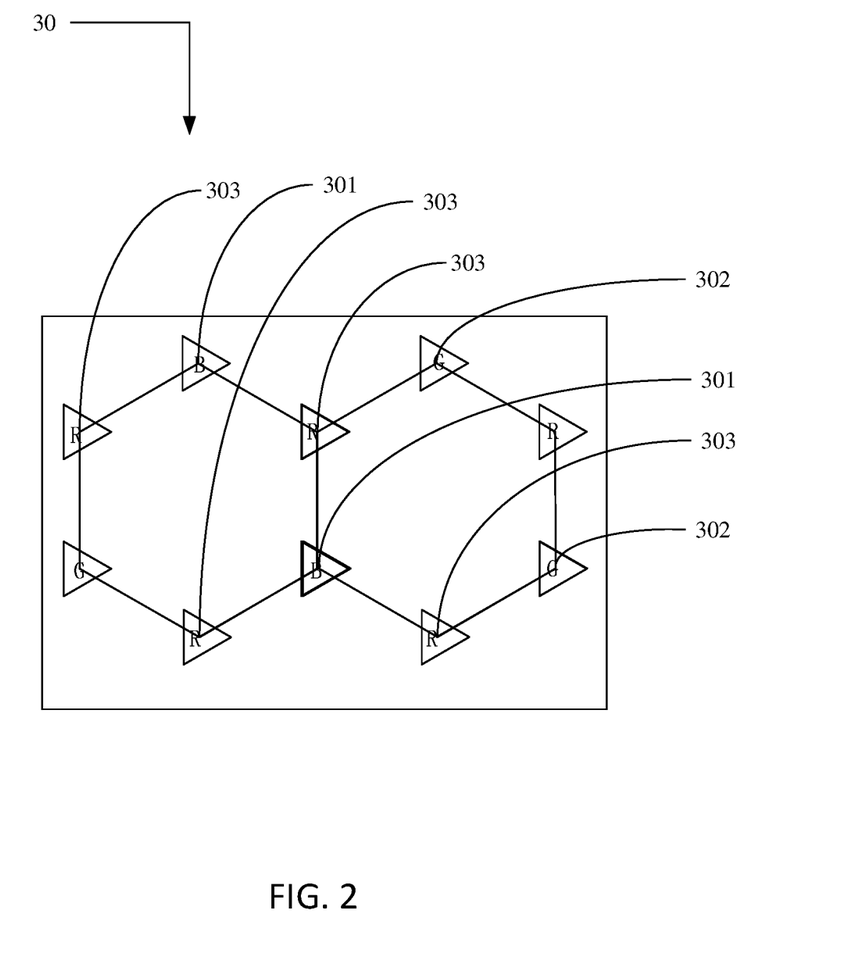
FIG. 2 is a first schematic diagram of a pixel unit of one embodiment of the present disclosure.

As shown in FIG. 1 and FIG. 2, the present disclosure provides a display panel including a first display area 10 and a second display area 20 disposed corresponding to a position of an electronic component, wherein a light transmittance of the second display area 20 is greater than a light transmittance of the first display area 10, and a plurality of pixel units 30 are disposed in the second display area 20. Each of the pixel units comprises a plurality of first sub-pixels 301, a plurality of second sub-pixels 302, and a plurality of third sub-pixels 303; a ratio of a number of the first sub-pixels 301 to the second sub-pixels 302 and the third sub-pixels 303 is 1:1:2 in each of the pixel units 30 of the second display area 20.

In one embodiment of the present disclosure, the display panel includes a first display area 10 and a second display area 20 disposed corresponding to a position of an electronic component, wherein a light transmittance of the second display area 20 is greater than a light transmittance of the first display area 10, and the plurality of pixel units 30 are disposed in the second display area 20. Each of the pixel units 30 comprises the plurality of first sub-pixels 301, the plurality of second sub-pixels 302, and the plurality of third sub-pixels 303; the ratio of a number of the first sub-pixels 301 to the second sub-pixels 302 and the third sub-pixels 303 is 1:1:2 in each of the pixel units of the second display area. By providing pixels with larger intervals in the second display area 20, a light transmittance above the electronic component in the second display area 20 is increased.

In one embodiment, the plurality of pixel units 30 are disposed in the first display area 10, and each of the pixel units 30 comprises the plurality of first sub-pixels 301, the plurality of second sub-pixels 302, and the plurality of third sub-pixels 303, the ratio of a number of the first sub-pixels 301 to the second sub-pixels 302 and the third sub-pixels 303 is 1:1:1 in each of the pixel units 30 of the first display area 10.

In one embodiment, as shown in FIG. 1, an angle between any sub-pixel and two adjacent sub-pixels in the second display area 20 is 120 degrees.

In one embodiment, in the second display area 20, the distances between the first sub-pixels 301 and the plurality of closest third sub-pixels 303 are the same.

In one embodiment, in the second display area 20, the distances between the second sub-pixels 302 and the plurality of closest third sub-pixels 303 are the same.

In one embodiment, as shown in FIG. 2, the plurality of third sub-pixels 303 are red sub-pixels.

In this embodiment, the plurality of first sub-pixels 301 are blue sub-pixels, and the plurality of second sub-pixels 302 are green sub-pixels.

In this embodiment, wherein the plurality of first sub-pixels 301 are green sub-pixels, the plurality of second sub-pixels 302 are blue sub-pixels.

Figure 3:
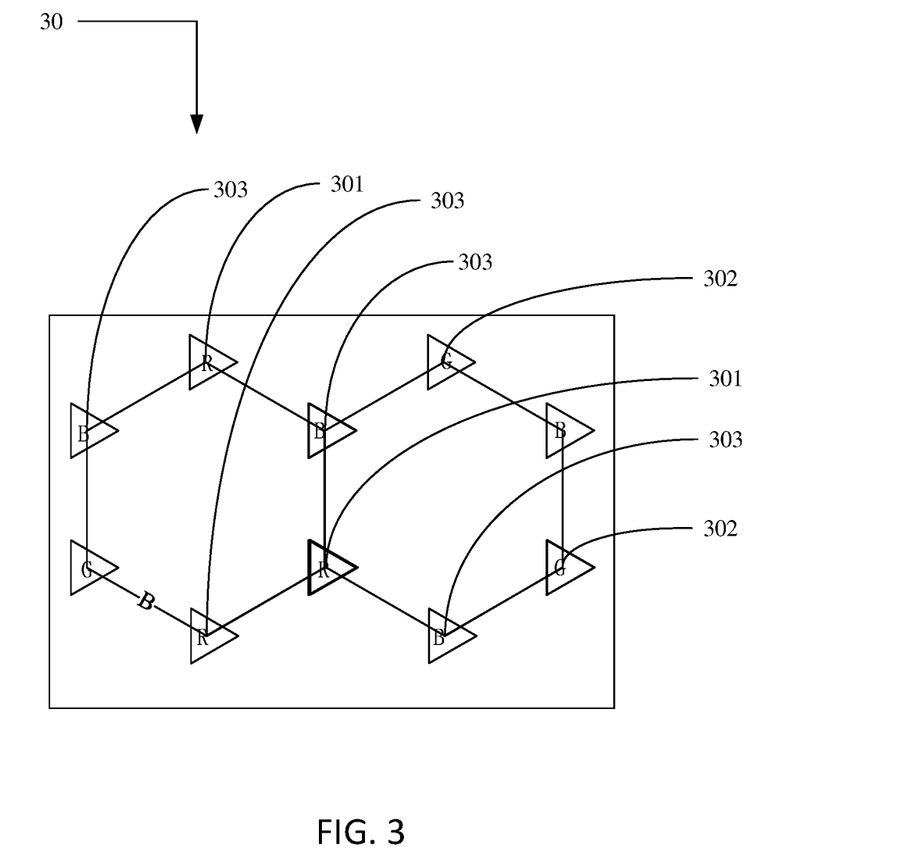
FIG. 3 is a second schematic diagram of a pixel unit of one embodiment of the present disclosure.

In one embodiment, as shown in FIG. 3, wherein the plurality of third sub-pixels 303 are blue sub-pixels.

In this embodiment, wherein the plurality of first sub-pixels 301 are red sub-pixels, the plurality of second sub-pixels 302 are green sub-pixels.

In this embodiment, wherein the plurality of first sub-pixel 301 are green sub-pixels, the plurality of second sub-pixels 302 are red sub-pixels.

Figure 4:
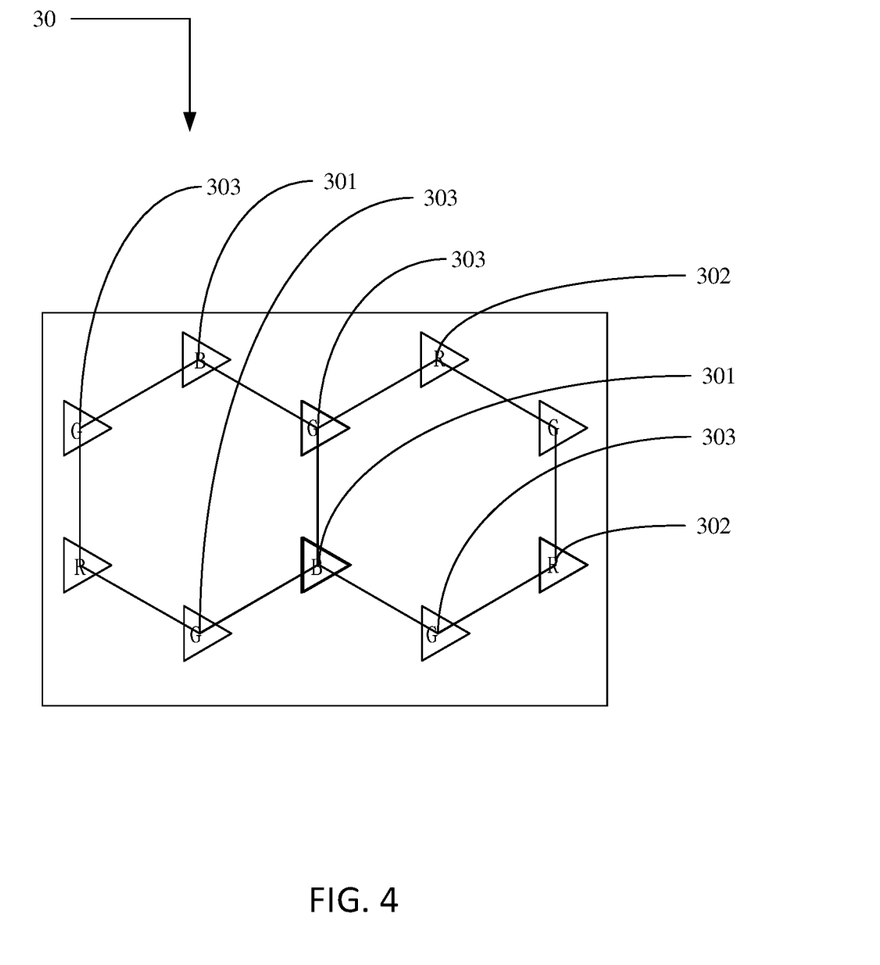
FIG. 4 is a third schematic diagram of a pixel unit of one embodiment of the present disclosure.

In one embodiment, as shown in FIG. 4, wherein the plurality of third sub-pixels 303 are green sub-pixels.

In this embodiment, wherein the plurality of first sub-pixels 301 are red sub-pixels, the second sub-pixel 302 are blue sub-pixels.

In this embodiment, wherein the plurality of first sub-pixels 301 are blue sub-pixels, the second sub-pixel 302 are red sub-pixels.

In one embodiment, the size, shape, and color of any sub-pixel can be designed according to the performance, life, and other performances of the red, green, and blue sub-pixels of the actual light-emitting device.

In this embodiment, sizes of the red sub-pixel, the green sub-pixel, and the blue sub-pixel are not the same.

In this embodiment, shapes of the red sub-pixel, the green sub-pixel, and the blue sub-pixel are not the same.

In one embodiment, the first sub-pixel 301 is at least one of a rectangular, a circular, a trapezoidal, or a triangular shape.

In one embodiment, the second sub-pixel 302 is at least one of a rectangular, a circular, a trapezoidal, or a triangular shape.

In one embodiment, the third sub-pixel 303 is at least one of a rectangular, a circular, a trapezoidal, or a triangular shape.

In one embodiment, a metal trace in the second display area 20 is arranged around the electronic component.

In this embodiment, the metal traces include data lines and scan lines.

In this embodiment, the data line is arranged around the electronic component.

In this embodiment, the scan line is arranged around the electronic component.

In one embodiment, the pixel drive circuit is optimized, conductive lines are disposed under the pixel, and a ratio of the circuit drive clearance area is increased.

In one embodiment, distances between the adjacent third sub-pixels 303 are equal in the pixel unit 30 of the second display area 20.

In one embodiment, a ratio of a distance between the adjacent first sub-pixels 301 to a distance between the adjacent second sub-pixels 302 and a distance between the adjacent third sub-pixels 303 is 1:1:1 in the pixel unit 30 of the second display area 20.

In one embodiment, the electronic component is a camera.

In one embodiment, the electronic component is a speaker or microphone.

As shown in FIG. 1 and FIG. 2, the present disclosure provides a display device including a display panel, frame structure, and a backlight source; the display panel including the first display area 10 and the second display area 20 disposed corresponding to the position of the electronic component, wherein the light transmittance of the second display area 20 is greater than the light transmittance of the first display area 10, the plurality of pixel units 30 are disposed in the second display area 20, and each of the pixel units 30 comprises the plurality of first sub-pixels 301, the plurality of second sub-pixels 302, and the plurality of third sub-pixels 303, the ratio of a number of the first sub-pixels 301 to the second sub-pixels 302 and the third sub-pixels 303 is 1:1:2 in each of the pixel units 30 of the second display area 20.

In one embodiment of the present disclosure, the display device includes the display panel, the frame structure, and the backlight source, the display panel includes the first display area 10 and the second display area 20 disposed corresponding to the position of the electronic component, wherein the light transmittance of the second display area 20 is greater than the light transmittance of the first display area 10, the plurality of pixel units 30 are disposed in the second display area 20, and each of the pixel units 30 comprises the plurality of first sub-pixels 301, the plurality of second sub-pixels 302, and the plurality of third sub-pixels 303, the ratio of a number of the first sub-pixels 301 to the second sub-pixels and the third sub-pixels is 1:1:2 in each of the pixel units of the second display area, by providing pixels with larger intervals in the second display area 20, increasing the light transmittance above the electronic component in the second display area 20.

In one embodiment, the plurality of pixel units 30 are disposed in the first display area 10, and each of the pixel units 30 comprises the plurality of first sub-pixels 301, the plurality of second sub-pixels 302, and the plurality of third sub-pixels 303, the ratio of a number of the first sub-pixels 301 to the second sub-pixels 302 and the third sub-pixels 303 is 1:1:1 in each of the pixel units 30 of the first display area 10 of the display device.

In one embodiment, as shown in FIG. 1, wherein the angle between any sub-pixel and two adjacent sub-pixels in the second display area 20 of the display device is 120 degrees.

In one embodiment, in the second display area 20 of the display device, the distances between the first sub-pixel 301 and the plurality of the closest third sub-pixels 303 are the same.

In one embodiment, in the second display area 20 of the display device, the distances between the second sub-pixels 302 and the plurality of the closest third sub-pixels 303 are the same.

In one embodiment, as shown in FIG. 2, wherein the plurality of third sub-pixels 303 are red sub-pixels.

In this embodiment, wherein the plurality of first sub-pixels 301 are blue sub-pixels, the plurality of second sub-pixels 302 are green sub-pixels.

In this embodiment, wherein the plurality of first sub-pixels 301 are green sub-pixels, the plurality of second sub-pixels 302 are blue sub-pixels.

In one embodiment, as shown in FIG. 3, wherein the plurality of third sub-pixels 303 are blue sub-pixels.

In this embodiment, wherein the plurality of first sub-pixels 301 are red sub-pixels, the plurality of second sub-pixels 302 are green sub-pixels.

In this embodiment, wherein the plurality of first sub-pixel 301 are green sub-pixels, the plurality of second sub-pixels 302 are red sub-pixels.

In one embodiment, as shown in FIG. 4, wherein the plurality of third sub-pixels 303 are green sub-pixels in the display device.

In this embodiment, wherein the plurality of first sub-pixels 301 are red sub-pixels, the second sub-pixel 302 are blue sub-pixels.

In this embodiment, wherein the plurality of first sub-pixels 301 are blue sub-pixels, the second sub-pixel 302 are red sub-pixels.

In one embodiment, the size, shape, and color of any sub-pixel can be designed according to the performance, life, and other performances of the red, green, and blue sub-pixels of the actual light-emitting device.

In this embodiment, sizes of the red sub-pixel, the green sub-pixel, and the blue sub-pixel are not the same.

In this embodiment, shapes of the red sub-pixel, the green sub-pixel, and the blue sub-pixel are not the same.

In one embodiment, the first sub-pixel 301 is at least one of a rectangular, a circular, a trapezoidal, or a triangular shape in the display device.

In one embodiment, the second sub-pixel 302 is at least one of a rectangular, a circular, a trapezoidal, or a triangular shape in the display device.

Figure 5:
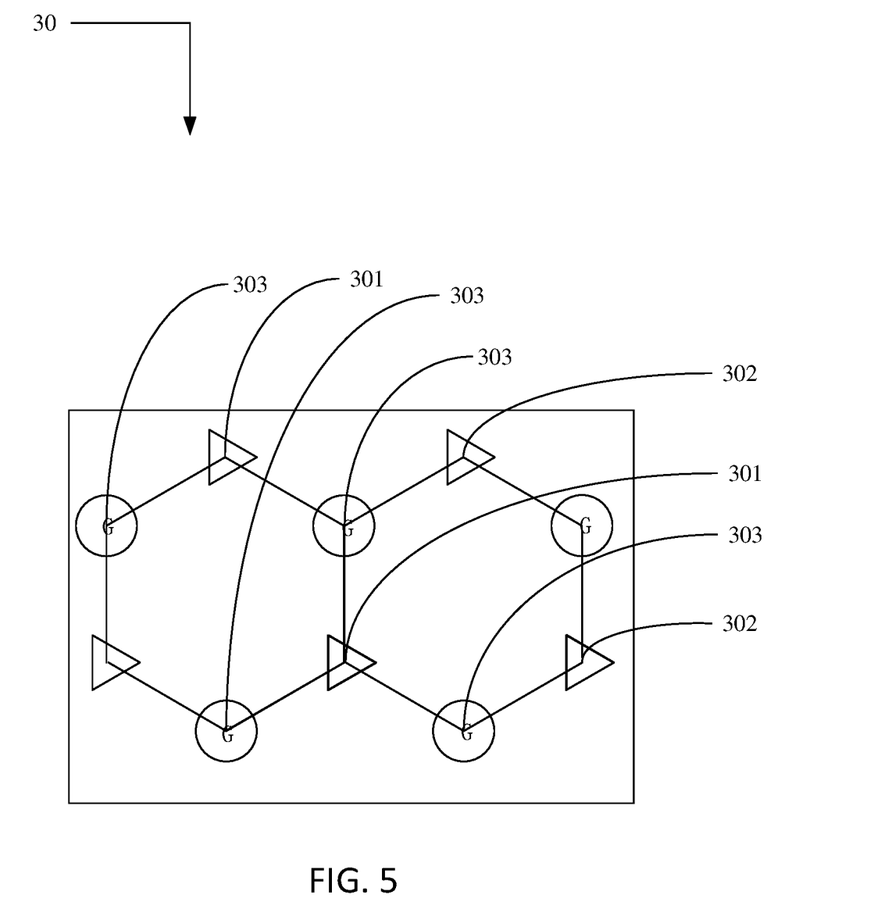
FIG. 5 is a fourth schematic diagram of a pixel unit of one embodiment of the present disclosure.

In one embodiment, as shown in FIG. 5, the third sub-pixel 303 is at least one of a rectangular, a circular, a trapezoidal, or a triangular shape in the display device.

In one embodiment, the metal trace in the second display area 20 is arranged around the electronic component.

In this embodiment, the metal traces include data lines and scan lines.

In this embodiment, the data line is arranged around the electronic component.

In this embodiment, the scan line is arranged around the electronic component.

In one embodiment, the pixel drive circuit is optimized conductive lines are disposed under the pixel and the ratio of the circuit drive clearance area is increased.

In one embodiment, distances between the adjacent third sub-pixels 303 are equal in the pixel unit 30 of the second display area 20.

In one embodiment, a ratio of a distance between the adjacent first sub-pixels 301 to a distance between the adjacent second sub-pixels 302 and a distance between the adjacent third sub-pixels 303 is 1:1:1 in the pixel unit 30 of the second display area 20.

In one embodiment, the electronic component is a camera.

According to the above embodiments:

The present disclosure provides a display panel, the display panel includes a first display area and a second display area corresponding to a position of an electronic component, a light transmittance of the second display area is greater than a light transmittance of the first display area, a plurality of pixel units are disposed in the second display area, and each of the pixel units comprises a plurality of first sub-pixels, a plurality of second sub-pixels, and a plurality of third sub-pixels, a ratio of a number of the first sub-pixels to the second sub-pixels and the third sub-pixels is 1:1:2 in each of the pixel units of the second display area, by providing pixels with larger intervals in the second display area, increasing a light transmittance above the electronic component.

In summary, although the present disclosure has been disclosed as preferred embodiments above, the above preferred embodiments are not intended to limit the present disclosure. Those of ordinary skill in the art can make various changes and retouching without departing from the spirit and scope of the present disclosure. Therefore, the protection scope of the present disclosure is subject to the scope defined by the claims.

What is claimed is:

1. A display panel, comprising:
a first display area and a second display area disposed corresponding to a position of an electronic component, wherein a light transmittance of the second display area is greater than a light transmittance of the first display area, a plurality of first pixel units are disposed in the second display area, and; a plurality of sub-pixels in the plurality of first pixel units are arranged in a honeycomb shape, and an angle between any of the plurality of sub-pixels and adjacent two of the plurality of sub-pixels is 120 degrees; and wherein the plurality of sub-pixels in each of the plurality of first pixel units comprises two first sub-pixels, two second sub-pixels, and four third sub-pixels.

2. The display panel as claimed in claim 1, wherein a plurality of second pixel units are disposed in the first display area, and each of the plurality of pixel units comprises a plurality of first sub-pixels, second sub-pixels, and third sub-pixels, and a ratio of the number of the first sub-pixels to the second sub-pixels and the third sub-pixels is 1:1:1 in each of the plurality of second pixel units of the first display area.

3. The display panel as claimed in claim 1, wherein the four third sub-pixels are red sub-pixels.

4. The display panel as claimed in claim 1, wherein the four third sub-pixels are blue sub-pixels.

5. The display panel as claimed in claim 1, wherein the four third sub-pixels are green sub-pixels.

6. The display panel as claimed in claim 1, wherein a metal trace in the second display area is arranged around the electronic component.

7. The display panel as claimed in claim 1, wherein distances between adjacent two of the third sub-pixels are equal in the plurality of first pixel units of the second display area.

8. The display panel as claimed in claim 7, wherein a ratio of a distance between adjacent two of the first sub-pixels to a distance between adjacent two of the second sub-pixels and a distance between adjacent two of the third sub-pixels is 1:1:1 in the plurality of first pixel units of the second display area.

9. The display panel as claimed in claim 1, wherein the electronic component is a camera.

10. A display device, comprising a display panel comprising a first display area and a second display area disposed corresponding to a position of an electronic component, wherein a light transmittance of the second display area is greater than a light transmittance of the first display area, a plurality of first pixel units are disposed in the second display area, and; a plurality of sub-pixels in the plurality of first pixel units are arranged in a honeycomb shape, and an angle between any of the plurality of sub-pixels and adjacent two of the plurality of sub-pixels is 120 degrees; and wherein the plurality of sub-pixels in each of the plurality of first pixel units comprises two first sub-pixels, two second sub-pixels, and four third sub-pixels.

11. The display device as claimed in claim 10, wherein a metal trace in the second display area is arranged around the electronic component.

12. The display device as claimed in claim 10, wherein distances between adjacent two of the third sub-pixels are equal in the plurality of first pixel units of the second display area.

13. The display device as claimed in claim 11, wherein a ratio of a distance between adjacent two of the first sub-pixels to a distance between adjacent two of the second sub-pixels and a distance between adjacent two of the third sub-pixels is 1:1:1 in the plurality of first pixel units of the second display area.

14. The display device as claimed in claim 10, wherein the electronic component is a camera.

15. The display device as claimed in claim 10, wherein a plurality of second pixel units are disposed in the first display area, and each of the plurality of pixel units comprises a plurality of first sub-pixels, second sub-pixels, and third sub-pixels, and a ratio of the number of the first sub-pixels to the second sub-pixels and the third sub-pixels is 1:1:1 in each of the plurality of second pixel units of the first display area.

16. The display device as claimed in claim 10, wherein the plurality of third sub-pixels are red sub-pixels.

17. The display device as claimed in claim 10, wherein the plurality of third sub-pixels are blue sub-pixels.

18. The display device as claimed in claim 10, wherein the plurality of third sub-pixels are green sub-pixels.

* * * * *